US008223569B2

(12) United States Patent
Hamano et al.

(10) Patent No.: US 8,223,569 B2
(45) Date of Patent: Jul. 17, 2012

(54) SEMICONDUCTOR MEMORY DEVICE (75) Inventors: Tomoyuki Hamano, Yokohama (JP);
Shigefumi Ishiguro, Chigasaki (JP);
Toshifumi Watanabe, Yokohama (JP);
Kazuto Uehara, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 218 days.

(21) Appl. No.: 12/836,851

(22) Filed: Jul. 15, 2010

(65) Prior Publication Data

US 2011/0013472 A1 Jan. 20, 2011

(30) Foreign Application Priority Data

Jul. 17, 2009 (JP) .................................. 2009-169254

(51) Int. Cl.
*G11C 7/00* (2006.01)

(52) U.S. Cl. .... 365/203; 365/233; 365/236; 365/230.06

(58) Field of Classification Search .................. 365/203, 365/233, 236, 130.06
See application file for complete search history.

(56) References Cited

U.S. PATENT DOCUMENTS 7,092,305 B2 * 8/2006 Watanabe et al. ............. 365/222
2002/0136081 A1 * 9/2002 Maesako et al. .............. 365/233
2002/0163846 A1 * 11/2002 Taruishi et al. ................ 365/222
2003/0147298 A1 * 8/2003 Ooishi et al. .................. 365/233
2009/0316494 A1 12/2009 Uehara et al.

FOREIGN PATENT DOCUMENTS

JP 2006-286179 10/2006

* cited by examiner

*Primary Examiner* — Tuan T. Nguyen
(74) *Attorney, Agent, or Firm* — Oblon, Spivak, McClelland, Maier & Neustadt, L.L.P.

(57) ABSTRACT

According to one embodiment, a semiconductor memory device includes a memory array, an address counter, an address detecting circuit and a control circuit. The memory array has a plurality of memory cells arranged at crossing positions of word lines and bit lines. The address counter increments an address including a row address and a column address in synchronism with a clock to sequentially output the incremented addresses. The address detecting circuit detects an address previous to an address including a row address to which the row address is switched at the address output from the address counter to output a detection signal. The control circuit performs a precharging operation to the bit lines connected to the memory cells according to the detection signal output from the address detecting circuit.

16 Claims, 6 Drawing Sheets

SEMICONDUCTOR MEMORY DEVICE

CROSS-REFERENCE TO RELATED APPLICATIONS

This application is based upon and claims the benefit of priority from Japanese Patent Application No. 2009-169254, filed Jul. 17, 2009; the entire contents of which are incorporated herein by reference.

FIELD

Embodiments described herein relate generally to a semiconductor memory device in which memories of a plurality of types are integrated on one chip, for example, a semiconductor memory device having a clock synchronizing operation.

BACKGROUND

As an example of a semiconductor memory device in which memories of a plurality of types are integrated on one chip, OneNAND (registered trademark) is known (for example, see Jpn. Pat. Appln. KOKAI Publication No. 2006-286179). This OneNAND is formed by integrating a NAND flash memory serving as a main memory unit and an SRAM serving as a buffer unit on one chip. Furthermore, for the OneNAND, for example, a controller on which a state machine is mounted is prepared to control data transfer between the NAND flash memory and the SRAM.

In the OneNAND, during a switching operation for selected word lines in a read operation or a write operation for the SRAM, a bit line needs to be precharged and equalized to a voltage level of a VDD power supply. Control of the precharging and the equalizing is activated by a counter address which changes in response to a clock CP generated in synchronism with a clock CLK supplied from the outside. For this reason, a time required until the precharging and the equalizing are started deteriorates an operation frequency and an access time.

More specifically, in a semiconductor memory device such as a OneNAND in which a bit line needs to be precharged and equalized during a switching operation for selected word lines in a read or write operation for an SRAM, a time from when row addresses are switched to when the precharging and equalizing are activated is a factor which deteriorates an operation frequency, an access time, and internal data transfer.

DETAILED DESCRIPTION

A semiconductor memory device according to an embodiment will be described below with reference to the accompanying drawings. As a semiconductor memory device, a OneNAND is exemplified here. In the explanation, the common reference numerals denote the common parts throughout the drawings.

In general, according to one embodiment, a semiconductor memory device includes a memory array, an address counter, an address detecting circuit and a control circuit. The memory array has a plurality of memory cells arranged at crossing positions of word lines and bit lines. The address counter increments an address including a row address and a column address in synchronism with a clock to sequentially output the incremented addresses. The address detecting circuit detects an address previous to an address including a row address to which the row address is switched at the address output from the address counter to output a detection signal. The control circuit performs a precharging operation to the bit lines connected to the memory cells according to the detection signal output from the address detecting circuit.

[1] Configuration of Semiconductor Memory Device According to Embodiment

Figure 1:
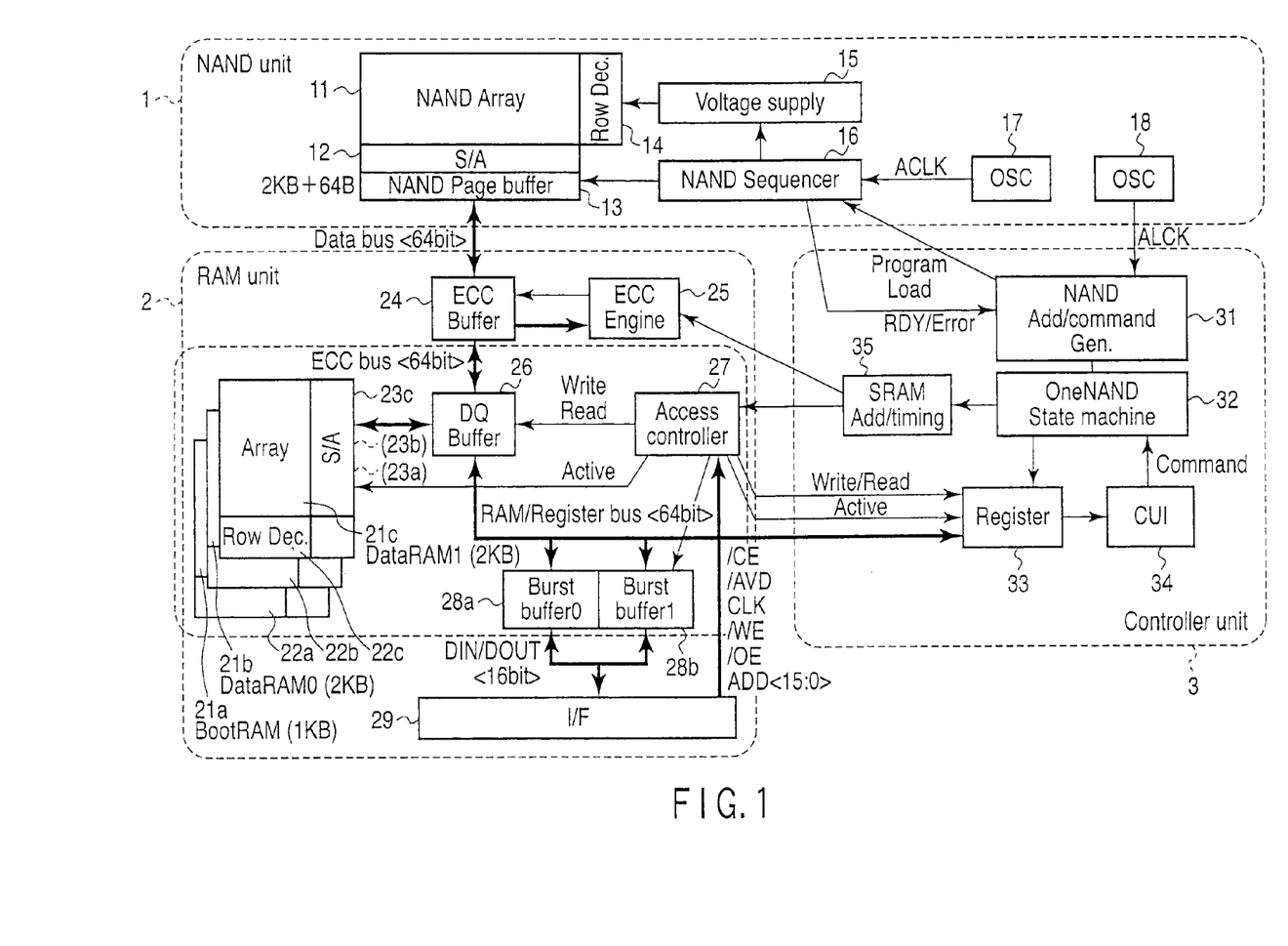
FIG. 1 is a block diagram showing a configuration of a semiconductor memory device according to an embodiment.

FIG. 1 is a block diagram showing a configuration of a semiconductor memory device according to the embodiment.

As shown in FIG. 1, the semiconductor memory device is obtained by integrating, on one ship, a NAND flash memory 1 serving as a main memory unit (NAND unit), an SRAM 2 serving as a buffer unit (RAM unit), and a controller 3 serving as a control unit (Controller unit) which controls the NAND flash memory 1 and the SRAM 2.

[1-1] Configuration of NAND Flash Memory 1

The NAND flash memory 1 comprises a memory cell array (NAND Array) 11, a sense amplifier (S/A) 12, a page buffer (NAND Page Buffer) 13, a row decoder (Row Dec.) 14, a voltage supply circuit (Voltage Supply) 15, a sequencer (NAND Sequencer) 16, and oscillators (OSC) 17 and 18.

The memory cell array 11 is a cell array of the NAND flash memory 1, and comprises a plurality of memory cells (not shown) arranged at crossing positions of bit lines and word lines in the form of a matrix. Each of the plurality of memory cells is constituted by a MOS transistor having a laminated gate structure including a floating gate electrode, an inter-gate insulating film, and a control gate electrode laminated in this order on, for example, a semiconductor substrate through a tunnel insulating film.

For example, each of the plurality of memory cells can hold 1-bit data according to a change in threshold voltage caused by a density of electrons injected in the floating gate electrode. Control of the threshold voltage may be segmentalized to allow each memory cell to hold data of two or more bits. The memory cell may have a MONOS (Metal Oxide Nitride Oxide Silicon) structure using a scheme which traps electrons in a nitride film.

The sense amplifier 12 reads data of a memory cell of one page in the memory cell array 11. In this case, the page means a unit in which data is collectively written or read in the NAND flash memory 1. For example, a plurality of memory cells connected to the same word line constitute one page.

The page buffer 13 temporarily stores read data or write data of one page under the control of the sequencer 16. For example, the page buffer 13 has a storage capacity of 2 KB+64 B.

The row decoder 14 is a decoder to select a word line of the memory cell array 11.

The voltage supply circuit 15 generates voltages (Internal Voltage) required for reading, writing, and erasing of the memory cell array 11 under the control of the sequencer 16 to supply the voltages to the row decoder 14.

The sequencer 16 controls writing (Program), reading (Load), or erasing to the NAND flash memory 1 in response to a command (Program/Load) for the NAND flash memory 1 issued by an address/command generating circuit (NAND Add/Command Gen.) 31.

The oscillator 17 generates an internal clock ACLK for an internal control circuit of the sequencer 16. The oscillator 18 generates an internal clock ACLK for an internal control circuit of the state machine (OneNAND State Machine) 32.

[1-2] Configuration of SRAM 2

The SRAM 2 comprises a plurality (in this example, three) of SRAM cell arrays (Array) 21a to 21c, a plurality of row decoders (Row Dec.) 22a to 22c, a plurality of sense amplifiers (S/A) 23a to 23c, an ECC buffer 24, an ECC engine 25, a DQ buffer 26, an access controller 27, burst buffers (Burst Read/Write buffer) 28a and 28b, and a user interface (I/F) 29.

Each of the SRAM cell arrays 21a to 21c stores write data programmed to the NAND flash memory 1 or read data loaded from the NAND flash memory 1. The SRAM cell arrays 21a to 21c are used as buffer memories to interact with an external host apparatus (not shown). The SRAM cell arrays 21a to 21c include a plurality of memory cells (SRAM cells) arranged at crossing positions of pairs of word lines and bit lines in the form of a matrix.

The row decoders 22a to 22c are decoders to select word lines of the SRAM cell arrays 21a to 21c.

The sense amplifiers 23a to 23c reads data of the SRAM cells. The sense amplifiers 23a to 23c also function as loads for writing.

In the embodiment, for example, the SRAM cell array 21a is a buffer memory functioning as a BootRAM constituted by 1 bank (1 KB) of bank 0. The SRAM cell array 21b is a buffer memory functioning as a DataRAM0 constituted by 2 banks (2 KB) of banks 0 and 1. The SRAM cell array 21c is a buffer memory functioning as a DataRAM1 constituted by 2 banks (2 KB) of banks 0 and 1. The number of DataRAMs is not limited to 2 (DataRAM0, 1), and other DataRAMs can be added.

The ECC buffer 24 is located between the SRAM 2 and the page buffer 13 and temporarily stores data for an ECC process (error correction in a data loading state or parity generation in execution of a data program). The ECC engine 25 corrects an error of data (Data) input to the ECC buffer 24. The ECC engine 25 outputs the corrected data (Correct) to the ECC buffer 24 again.

The DQ buffer 26 temporarily stores data to read (Read) data from the SRAM cell arrays 21a to 21c and to write (Write) data in the SRAM cell arrays 21a to 21c.

The access controller 27 receives an address (ADD <15:0>), control signals (/CE, /AVD, CLK, /WE, and /OE) and the like input from the user interface 29 to perform necessary control to the internal circuits.

For example, the access controller 27 comprises a control circuit to execute a clock synchronized burst read function and a clock synchronized burst write function which are operated in synchronism with a clock. The control circuit controls burst buffers (Burst buffer0) 28a and (Burst buffer1) 28b in a clock synchronized burst read state and a clock synchronized burst write state.

The burst buffers 28a and 28b temporarily store data to read data or write data, respectively.

The user interface 29 supports the same interface standard as that of a NOR flash memory to input an address and a control signal from the external host apparatus and input/output data to/from the external host apparatus.

[1-3] Configuration of Controller 3

The controller 3 comprises an address/command generating circuit 31, a state machine 32, a register 33, a CUI (Command User Interface) 34, and an address/timing generating circuit (SRAM Add/Timing) 35.

The address/command generating circuit 31 generates a control signal such as an address or a command to a NAND core (NAND unit) as needed in an internal sequence operation.

The state machine 32 controls an internal sequence operation according to a type of a command when a command is issued from the address/command generating circuit 31 or when an internal command signal is issued from the CUI 34.

The register 33 sets an operation state of a function. The register 33 allocates a part of an external address space to read or write a control signal such as an address or a command by the external host apparatus through the user interface 29.

The CUI 34 recognizes that a function execution command is given, from the fact that a control signal such as an address or a command is written in a predetermined external address space of the register 33, thereby issuing an internal command signal.

The address/timing generating circuit 35 generates a control signal such as an address or a timing to control the SRAM 2 as needed in the internal sequence operation.

In the embodiment, the page buffer 13 and the ECC buffer 24 are connected to each other by a 64-bit NAND data bus. The ECC buffer 24 and the DQ buffer 26 are connected to each other by a 64-bit ECC data bus. The DQ buffer 26 and the sense amplifiers 23a to 23c are connected to each other by a 64-bit SRAM data bus. The DQ buffer 26, the burst buffers 28a and 28b, and the register 33 are connected to each other by a 64-bit (4×16-I/O) RAM/Register data bus. Furthermore, the burst buffers 28a and 28b and the user interface 29 are connected to each other by a 16-bit Data Input/Output (DIN/DOUT) bus.

[1-4] Configuration of Bit Line Precharging and Equalizing Activation Control Circuit The access controller 27 in the SRAM 2 performs necessary control to the SRAM cell arrays (BootRAM, DataRAM0, 1) 21a to 21c in response to an address (ADD <15:0>), a control signal (CLK, /CE, /AVD, /WE, and /OE) and the like input from the user interface 29. The address ADD includes a row address to select a word line and a column address to select a bit line.

The access controller 27 comprises a bit line precharging and equalizing activation control circuit. The precharging and equalizing activation control circuit controls a precharging operation to precharge and equalize bit lines connected to memory cells when selection of the word lines connected to the memory cells in the SRAM cell arrays 21a to 21c is switched. In the precharging and the equalizing (precharging operation), potentials of the bit line pair BL and /BL are charged to a VDD voltage by a VDD power supply, and set to the same potential.

Figure 2:
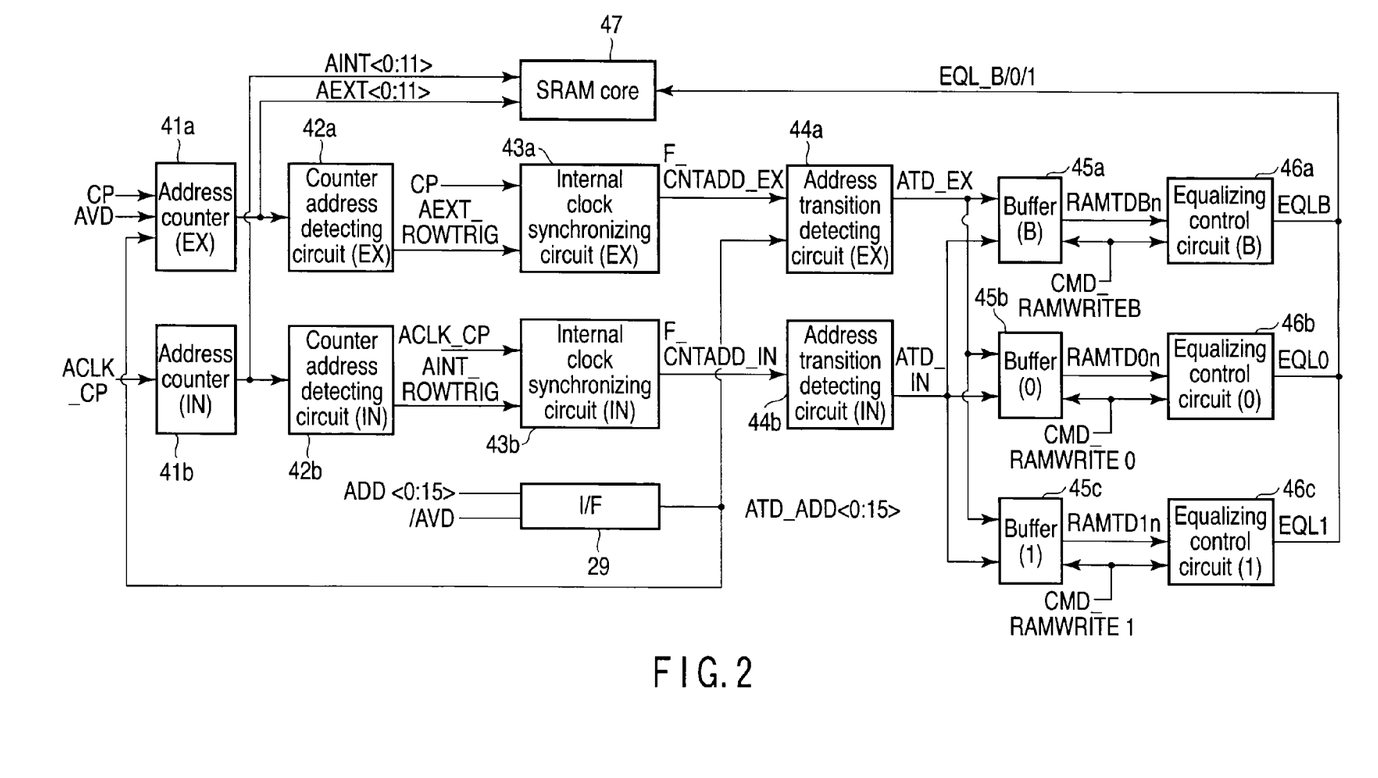
FIG. 2 is a block diagram showing a configuration of precharging and equalizing activation control circuits and a peripheral circuit thereof in an access controller according to the embodiment.

FIG. 2 is a block diagram showing a configuration of a precharging and equalizing activation control circuit and a peripheral circuit thereof in the access controller 27.

The precharging and equalizing activation control circuit comprises an address counter (EX) 41a, an address counter (IN) 41b, a counter address detecting circuit (EX) 42a, a counter address detecting circuit (IN) 42b, an internal clock synchronizing circuit (EX) 43a, an internal clock synchronizing circuit (IN) 43b, an address transition detecting circuit (EX) 44a, an address transition detecting circuit (IN) 44b, a buffer (B) 45a, a buffer (0) 45b, a buffer (1) 45c, an equalization control circuit (B) 46a, an equalization control circuit (0) 46b, and an equalization control circuit (1) 46c. An SRAM core 47 and the user interface 29 are included in the SRAM 2.

An operation of the bit line precharging and equalizing activation control circuit shown in FIG. 2 will be described below.

Before giving the description, note that the operation is divided into a read operation or a write operation (external synchronizing operation) performed in synchronism with a clock (external clock) input from the external host apparatus, and a read operation or a write operation (internal operation) performed in synchronism with a clock (internal clock) generated in the memory device.

The external synchronizing operation is an operation in which data is exchanged between the BootRAM or the DataRAM0, 1 and the user interface 29. The internal operation is an operation in which data is exchanged between the BootRAM or the DataRAM0, 1 and the memory cell array 11.

In FIG. 2, (EX) indicates a circuit used in the external synchronizing operation, and (IN) indicates a circuit used in the internal operation. (B) indicates a circuit corresponding to the BootRAM, and (0) and (1) indicate circuits corresponding to the DataRAM0 and the DataRAM1, respectively.

An external synchronizing operation in the precharging and equalizing activation control circuit will be described first.

An address ADD<0:15> and an address valid signal /AVD are input to the user interface 29. At this time, the user interface 29 outputs a signal ATD_ADD<0:15> to the address transition detecting circuit (EX) 44a. The address transition detecting circuit (EX) 44a detects switching of addresses ADD to output a signal ATD_EX to the buffer (B) 45a, the buffer (0) 45b, and the buffer (1) 45c.

In this case, a signal CMD_RAMWRITEB, a signal CMD_RAMWRITE0, and a signal CMD_RAMWRITE1 are input to the buffer (B) 45a, the buffer (0) 45b, and the buffer (1) 45c, respectively. The signals CMD_RAMWRITEB, the CMD_RAMWRITE0, and the CMD_RAMWRITE1 are signals output from the register 33 in the controller 3, and are signals which designate that the operation is an internal operation performed between the NAND flash memory 1 and the SRAM 2. In this case, the signals CMD_RAMWRITEB, CMD_RAMWRITE0, and CMD_RAMWRITE1 designate that the operation is not an internal operation, i.e., is an external synchronizing operation.

The buffer (B) 45a, the buffer (0) 45b, and the buffer (1) 45c temporarily store the signal ATD_EX to output address transition detecting signals RAMTDBn, RAMTD0n, and RAMTD1n to the equalizing control circuit (B) 46a, the equalizing control circuit (0) 46b, and the equalizing control circuit (1) 46c, respectively.

Decode signals are input to the equalizing control circuit (B) 46a, the equalizing control circuit (0) 46b, and the equalizing control circuit (1) 46c. By the decode signals, one of the equalizing control circuit (B) 46a, the equalizing control circuit (0) 46b, and the equalizing control circuit (1) 46c is selected.

The selected one of the equalizing control circuit (B) 46a, the equalizing control circuit (0) 46b, and the equalizing control circuit (1) 46c outputs an equalizing signal EQLB or a signal EQL0 or EQL1, which precharges and equalizes a bit line connected to a memory cell, to the SRAM core 47 according to the address transition detecting signal RAMTDBn or the signal RAMTD0n or the signal RAMTD1n.

The SRAM core 47 precharges and equalizes bit lines in the BootRAM or the DataRAM0 or the DataRAM1 according to the signal EQLB or the signal EQL0 or EQL1.

The signal ATD_ADD<0:15> output from the user interface 29 is input to the address counter (EX) 41a. The internal clock CP and the address valid signal /AVD are input to the address counter (EX) 41a together with the signal ATD_ADD<0:15>. The address counter (EX) 41a stores the address ATD_ADD<0:15> as a counter address and outputs an address AEXT<0:11> to the SRAM core 47.

Thereafter, when a predetermined latency time has elapsed, the address counter (EX) 41a becomes enable. At this time, the address counter (EX) 41a begins to count counter addresses. More specifically, the address counter increments the stored counter address in synchronism with the internal clock CP and sequentially outputs the incremented address AEXT<0:11> to the counter address detecting circuit (EX) 42a. At the same time, the address AEXT<0:11> is output to the SRAM core 47.

The counter address detecting circuit (EX) 42a detects an address previous to an address including a row address to which the row address is switched at the address AEXT<0:11> output from the address counter (EX) 41a, i.e., detects a previous address of the address at which selections of the word lines are switched, and outputs a predetermined pulse as a signal AEXT_ROWTRIG to the internal clock synchronizing circuit (EX) 43a. The previous address detected by the counter address detecting circuit (EX) 42a is output immediately before the address including a row address to which the row address is switched.

The internal clock synchronizing circuit (EX) 43a outputs a signal F_CNTADD_EX synchronized with the internal clock CP to the address transition detecting circuit (EX) 44a in a period during which a predetermined pulse of the signal AEXT_ROWTRIG is input.

The address transition detecting circuit (EX) 44a outputs a signal ATD_EX to the buffer (B) 45a, the buffer (0) 45b, and the buffer (1) 45c according to the signal F_CNTADD_EX.

The subsequent operation including the operations of the buffer (B) 45a, the buffer (0) 45b, and the buffer (1) 45c is the same as described above.

An internal operation in the precharging and equalizing activation control circuit will be described below.

In the internal operation, in place of the address counter (EX) 41a, the counter address detecting circuit (EX) 42a, the internal clock synchronizing circuit (EX) 43a, and the address transition detecting circuit (EX) 44a, the address counter (IN) 41b, the counter address detecting circuit (IN) 42b, the internal clock synchronizing circuit (IN) 43b, and the address transition detecting circuit (IN) 44b are used, respectively. The operation is almost the same as the external synchronizing operation, and is as follows.

A signal which activates the internal operation makes the address counter (IN) 41b enable. At this time, the address counter (IN) 41b begins to count counter addresses. More specifically, the address counter increments the stored counter address in synchronism with the internal clock ACLK_CP and sequentially outputs the incremented address AINT<0:11> to the counter address detecting circuit (IN) 42b. At the same time, the address AINT<0:11> is output to the SRAM core 47.

The counter address detecting circuit (IN) 42b detects an address previous to an address including a row address to which the row address is switched at the address AINT<0:11> output from the address counter (IN) 41b, i.e., detects a previous address of the address at which selections of the word lines are switched, and outputs a predetermined pulse as a signal AINT_ROWTRIG to the internal clock synchronizing circuit (IN) 43b.

The internal clock synchronizing circuit (IN) 43b outputs a signal F_CNTADD_IN synchronized with the internal clock CP to the address transition detecting circuit (IN) 44b in a period during which a predetermined pulse of the signal AINT_ROWTRIG is input.

The address transition detecting circuit (IN) 44b outputs a signal ATD_IN to the buffer (B) 45a, the buffer (0) 45b, and the buffer (1) 45c according to the signal F_CNTADD_IN.

The signal CMD_RAMWRITEB, the signal CMD_RAMWRITE0, and the signal CMD_RAMWRITE1 are input to the buffer (B) 45a, the buffer (0) 45b, and the buffer (1) 45c, respectively. In this case, the signals CMD_RAMWRITEB, CMD_RAMWRITE0, and CMD_RAMWRITE1 designate that the operation is an internal operation.

The buffer (B) 45a, the buffer (0) 45b, and the buffer (1) 45c temporarily store the signal ATD_IN to output address transition detecting signals RAMTDBn, RAMTD0n, and RAMTD1n to the equalizing control circuit (B) 46a, the equalizing control circuit (0) 46b, and the equalizing control circuit (1) 46c, respectively.

Decode signals are input to the equalizing control circuit (B) 46a, the equalizing control circuit (0) 46b, and the equalizing control circuit (1) 46c. By the decode signals, one of the equalizing control circuit (B) 46a, the equalizing control circuit (0) 46b, and the equalizing control circuit (1) 46c is selected.

The selected one of the equalizing control circuit (B) 46a, the equalizing control circuit (0) 46b, and the equalizing control circuit (1) 46c outputs the equalizing signal EQLB or the signal EQL0 or EQL1, which precharges and equalizes a bit line connected to a memory cell, to the SRAM core 47 according to the address transition detecting signal RAMTDBn or the signal RAMTD0n or the signal RAMTD1n.

The SRAM core 47 precharges and equalizes bit lines in the BootRAM or the DataRAM0 or the DataRAM1 according to the signal EQLB or the signal EQL0 or EQL1.

[1-4-1] Configuration of SRAM Core 47

The SRAM core 47 shown in FIG. 2, i.e., the configuration of the SRAM cell arrays 21a, 21b, and 21c and the row decoders 22a, 22b, and 22c shown in FIG. 1 will be described below.

Figure 3:
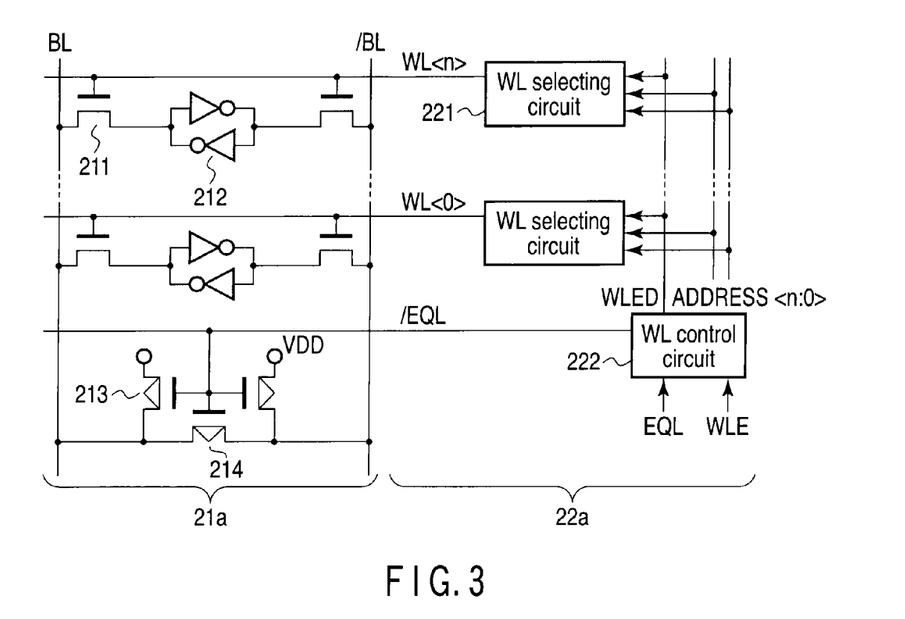
FIG. 3 is a circuit diagram showing a configuration of an SRAM cell array and a row decoder in an SRAM according to the embodiment.

FIG. 3 is a circuit diagram showing a configuration of an SRAM cell array and a row decoder in the SRAM 2. The configurations of the SRAM cell arrays 21a, 21b, and 21c are the same, and the configurations of the row decoders 22a, 22b, and 22c are the same. For this reason, the configurations of the SRAM cell array 21a and the row decoder 22a will be described below, and other explanations will be omitted.

As shown in FIG. 3, the SRAM cell array 21a comprises a plurality of SRAM cells 212 arranged at crossing positions of word lines WL<0> to WL<n> and the bit line pair BL and /BL in the form of a matrix.

Each of the SRAM cells 212 comprises 2 C-MOS inverters inversely connected in parallel with each other. Each of the SRAM cells 212 is connected to the bit line pair BL and /BL through a transfer transistor (N-MOS transistor) 211 comprising a gate connected to the word lines WL<0> to WL<n>.

In the SRAM cell array 21a, a bit line precharging transistor 213 and an equalizing transistor 214 are arranged at crossing positions of the equalizing line /EQL and the bit line pair BL and /BL, respectively.

The bit line precharging transistor 213 is constituted by a P-MOS transistor to precharge potentials of the bit line pair BL and /BL by the VDD power supply. The equalizing transistor 214 is constituted by a P-MOS transistor to equalize the potentials of the bit line pair BL and /BL, i.e., to make the potentials thereof equal to each other.

The row decoder 22a comprises a word line (WL) selecting circuit 221 and a word line (WL) control circuit 222. The WL selecting circuit 221 is arranged for each of the word lines WL<0> to WL<n> to select the word lines WL<0> to WL<n> based on an address <n:0>. The WL control circuit 222 controls the WL selecting circuit 221 and the equalizing line /EQL.

When the WL selecting circuit 221 and the WL control circuit 222 precharge and equalize the bit lines BL and /BL under the control of the access controller 27 including the precharging and equalizing activation control circuit, the WL selecting circuit 221 and the WL control circuit 222 precharge the potentials of the bit lines BL and /BL by the VDD power supply and, at the same time, temporarily control the potentials of the corresponding word lines WL<0> to WL<n> to a "0" level.

Figure 4:
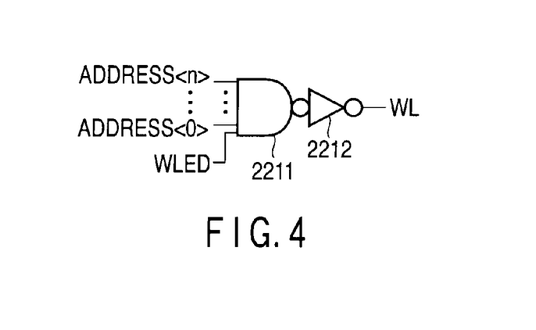
FIG. 4 is a circuit diagram showing a configuration of a word line selecting circuit in a row decoder according to the embodiment.

FIG. 4 is a circuit diagram showing a configuration of the WL selecting circuit 221 in the row decoder 22a.

The WL selecting circuit includes a NAND element 2211 and an inverter 2212. An address <n:0> and a signal WLED are input to an input terminal of the NAND element 2211. In the NAND element 2211, the word line WL is selected based on the address <n:0>. An output from the NAND element 2211 is output to a selected word line through the inverter 2212.

Figure 5:
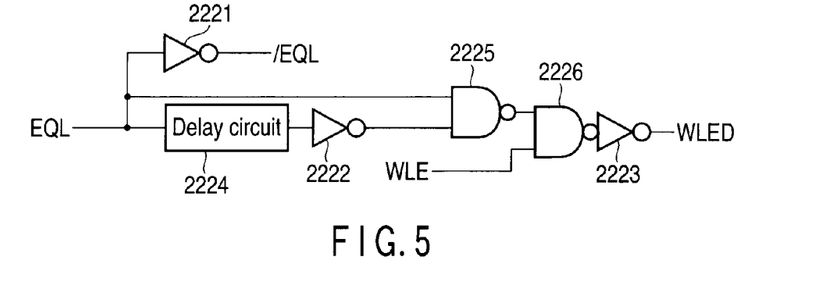
FIG. 5 is a circuit diagram showing a configuration of a word line control circuit in a row decoder according to the embodiment.

FIG. 5 is a circuit diagram showing a configuration of the WL control circuit 222 in the row decoder 22a.

The WL control circuit 222 includes inverters 2221, 2222, and 2223, a delay circuit 2224, and NAND elements 2225 and 2226. An equalizing signal EQL is input to the inverter 2221 to output an equalizing signal /EQL serving as an inverted signal of the signal EQL.

The equalizing signal EQL is input to a first input terminal of the NAND element 2225 and input to a second input terminal of the NAND element 2225 through the delay circuit 2224 and the inverter 2222. An output from the NAND element 2225 is input to a first input terminal of the NAND element 2226, and a signal WLE which activates a word line is input to a second input terminal of the NAND element 2226. An output from the NAND element 2226 is output as a signal WLED through the inverter 2223.

[2] Operation of Semiconductor Memory Device According to Embodiment

[2-1] Basic Operation of Semiconductor Memory Device

In this case, a normal read operation of reading data written in the memory cell array 11 will be described.

In the normal read operation, a user sets, to the register 33, a NAND address and an SRAM address of data to be loaded from the external host apparatus through the user interface 29.

The user sets a load command to the register 33 from the external host apparatus through the user interface 29. When a command is written in the register 33, the CUI 34 recognizes a function execution command to generate an internal command signal. In this case, a load command is established.

In response to the establishment of the load command, the state machine 32 is activated. After the state machine 32 initializes a necessary circuit, the state machine 32 requests the address/command generating circuit 31 to issue a sense command to the NAND unit 1.

At this time, the address/command generating circuit 31 issues a sense command to the sequencer 16 to sense data of a NAND address set to the register 33.

In response to the sense command, the sequencer 16 is activated. After the sequencer 16 initializes a necessary circuit, the sequencer 16 controls the voltage supply circuit 15, the row decoder 14, the sense amplifier 12, and the page buffer 13 to perform a sense operation to a designated NAND address. The sense data (cell data) loaded from the memory cell array 11 is stored in the page buffer 13.

When the sense data is stored in the page buffer 13, the sequencer 16 notifies the state machine 33 that the sense operation to the memory cell array 11 has ended.

The state machine 32 which has received the notification requests the address/command generating circuit 31 to issue a read command (clock).

The read command from the address/command generating circuit 31 is sent to the sequencer 16. The sequencer 16 which has received the read command sets the page buffer 13 to be readable.

In this manner, according to a request from the state machine 32, the read command from the address/command generating circuit 31 is issued to the sequencer 16 to read the data in the page buffer 13 to a NAND data bus, and the data is transferred to the ECC buffer 24.

Thereafter, when an ECC correction start control signal is issued from the state machine 32 through the address/timing generating circuit 35, the ECC engine 25 corrects an error of data from the ECC buffer 24 and outputs the corrected data to the ECC buffer 24.

The corrected data in the ECC buffer 24 is read to the ECC data bus and transferred to the DQ buffer 26.

The DQ buffer 26, for example, sends the stored data from the SRAM data bus to the corresponding SRAM cell array 21b through the sense amplifier 23b. In the SRAM cell array 21b, data writing is performed according to the SRAM address.

When a user inputs a control signal to read data from the external host apparatus through the user interface 29, the access controller 27 reads the data from the SRAM cell array 21b to the DQ buffer 26. The data read to the DQ buffer 26 is output to the external host apparatus through, for example, a RAM/Register data bus, the burst buffer 28a, and the user interface 29. In this manner, the normal read operation ends.

[2-2] Read Operation/Write Operation in SRAM 2 of Semiconductor Memory Device

A read operation and a write operation to the SRAM cell arrays (BootRAM, DataRAM0, 1) 21a to 21c in the semiconductor memory device according to the embodiment will be described. In the read operation and the write operation to the SRAM cell array, a precharging operation for precharging and equalizing the bit line pair BL and /BL connected to memory cells in the SRAM cell array is performed. In this case, a precharging operation for precharging and equalizing the bit lines will be described in detail.

Before giving the description, note that the operation is divided into an external synchronizing operation performed in synchronism with an external clock and an internal operation performed in synchronism with an internal clock. The external synchronizing operation is an operation in which data is exchanged between the BootRAM or the DataRAM0, 1 and the user interface 29. The internal operation is an operation in which data is exchanged between the BootRAM or the DataRAM0, 1 and the memory cell array 11.

[2-2-1] External Synchronizing Operation

Figure 6:
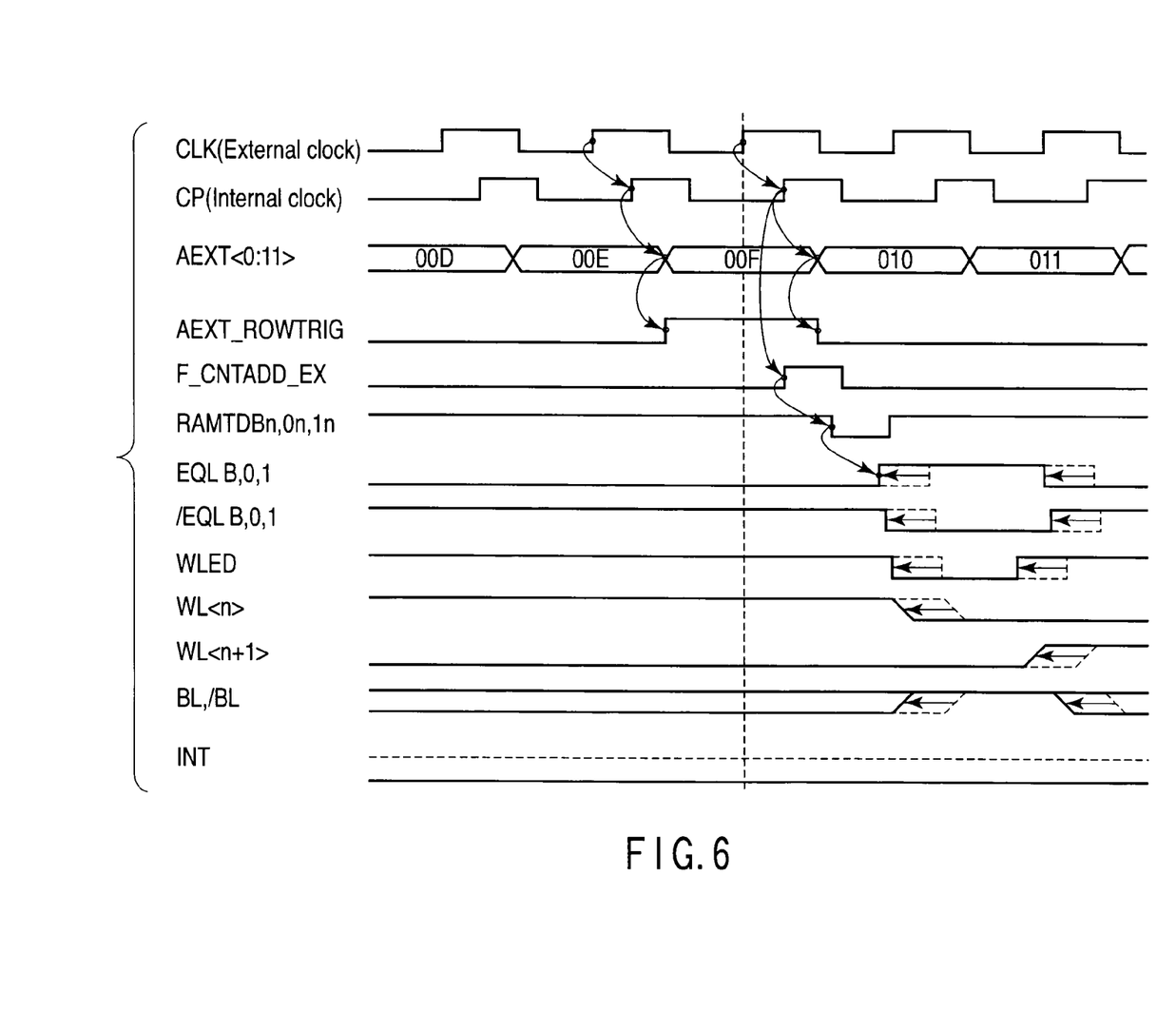
FIG. 6 is a timing chart of a precharging operation in an external synchronizing operation to an SRAM cell array according to the embodiment.

FIG. 6 is a timing chart of a precharging operation in an external synchronizing operation to the SRAM cell array (BootRAM or DataRAM0 or DataRAM1).

Signals will be described first. The external clock CLK is a clock input from the outside. The internal clock CP is a clock internally generated in synchronism with the external clock. The address AEXT<0:11> is an address which is incremented and output by the address counter (EX) 41a in the external synchronizing operation. A change from address "00D (hexadecimal number)" to address "011" indicates transition of the address, and a change from address "00F" to address "010" indicates switching of row addresses, i.e., switching of selections of word lines.

The signal AEXT_ROWTRIG is a signal output from the counter address detecting circuit (EX) 42a upon detection of an address previous to an address including a row address to which row address is switched when the address is incremented and output by the address counter (EX) 41a.

A signal F_CNTADD_EX is a signal output from the internal clock synchronizing circuit (EX) 43a in synchronism with the internal clock CP in a period during which the signal AEXT_ROWTRIG is output (in this case, "H").

The signals RAMTDBn, RAMTD0n, and RAMTD1n are signals output according to a pulse of the signal F_CNTADD_EX.

The equalizing signals EQLB, EQL0, and EQL1 are signals to execute precharging and equalizing (precharging operation) to the bit line pair BL and /BL connected to the memory cells in the SRAM cell array (BootRAM and DataRAM0, 1). Equalizing signals /EQLB, /EQL0, and /EQL1 are inverted signals of the above equalizing signals, respectively.

The signal WLED is a signal which controls a potential of a selected word line. Signals WL<n> and WL<n+1> are signals supplied to the word lines WL<n> and WL<n+1>, respectively. The signals BL and /BL are signals supplied to the bit lines BL and /BL, respectively. The signal INT indicates one of an internal operation and an external synchronizing operation as an operation to be performed. When the internal operation is performed, the signal INT becomes "H".

The external synchronizing operation will be described below with reference to FIG. 6.

In the synchronizing operation, in synchronism with a leading edge of the internal clock CP, the address is incremented by the address counter (EX) 41a. The incremented addresses are sequentially output.

In the switching of the addresses, when an address previous to an address including a row address to which a row address is switched, i.e., a previous address of an address at which selections of word lines are switched is detected, the signal AEXT_ROWTRIG rises from "L" to "H". In this case, when a change from address "00E" to address "00F" is detected, the signal AEXT_ROWTRIG changes from "L" to "H". When a change from address "00F" to address "010" is detected, the signal AEXT_ROWTRIG changes from "H" to "L".

In a period during which the signal AEXT_ROWTRIG is at "H", when the internal clock CP rises from "L" to "H", the signal FCNTADD EX is set to "H" for a predetermined period of time in synchronism with the leading edge of the internal clock CP. More specifically, an "H" pulse is output as the signal F_CNTADD_EX. Furthermore, according to the "H" pulse of the signal F_CNTADD_EX, the signals RAMTDBn, RAMTD0n, and RAMTD1n are set to "L" for a predetermined period of time. More specifically, an "L" pulse is output.

According to leading edges of the signals RAMTDBn, RAMTD0n, and RAMTD1n, the equalizing signals EQLB, EQL0, and EQL1 are set to "H" for a predetermined period of time, and the equalizing signals /EQLB, /EQL0, and /EQL1 are set to "L" for a predetermined period of time.

In this manner, precharging and equalizing (precharging operation) to the bit line pair BL and /BL are started, and end after a predetermined time. At this time, the selected word line WL<n> becomes unselected, and the potential of the word line WL<n> becomes "L". Subsequently, the word line WL<n+1> is selected, and the potential of the word line WL<n+1> becomes "H". Then, an operation performed by the sense amplifier is started.

In the external synchronizing operation, in a read operation and a write operation performed in synchronism with a clock, it is detected that an address previous to an address including a row address to which a row address is switched is output, and a precharging operation for precharging and equalizing the bit lines is activated. The precharging operation for performing precharging and equalizing may be activated according to a clock previous to a clock serving as a trigger for outputting an address including a row address to which a row address is switched.

In this manner, the precharging operation performed when selections of the word lines are switched can be advanced by 1 clock, and the read operation and the write operation can be performed at a high frequency and a high speed. In this case, the example in which the precharging operation is advanced by 1 clock has been described. However, the precharging operation can also be advanced by 0.5 clocks or 1.5 clocks.

In a period during which a detection signal indicating the detection of an address previous to an address including a row address to which a row address is switched is output, a precharging operation for performing precharging and equalizing in synchronism with an internal clock is activated. In this manner, data obtained 1 clock before can be prevented from being damaged, and a word line can also be prevented from being erroneously selected.

[2-2-2] Internal Operation

Figure 7:
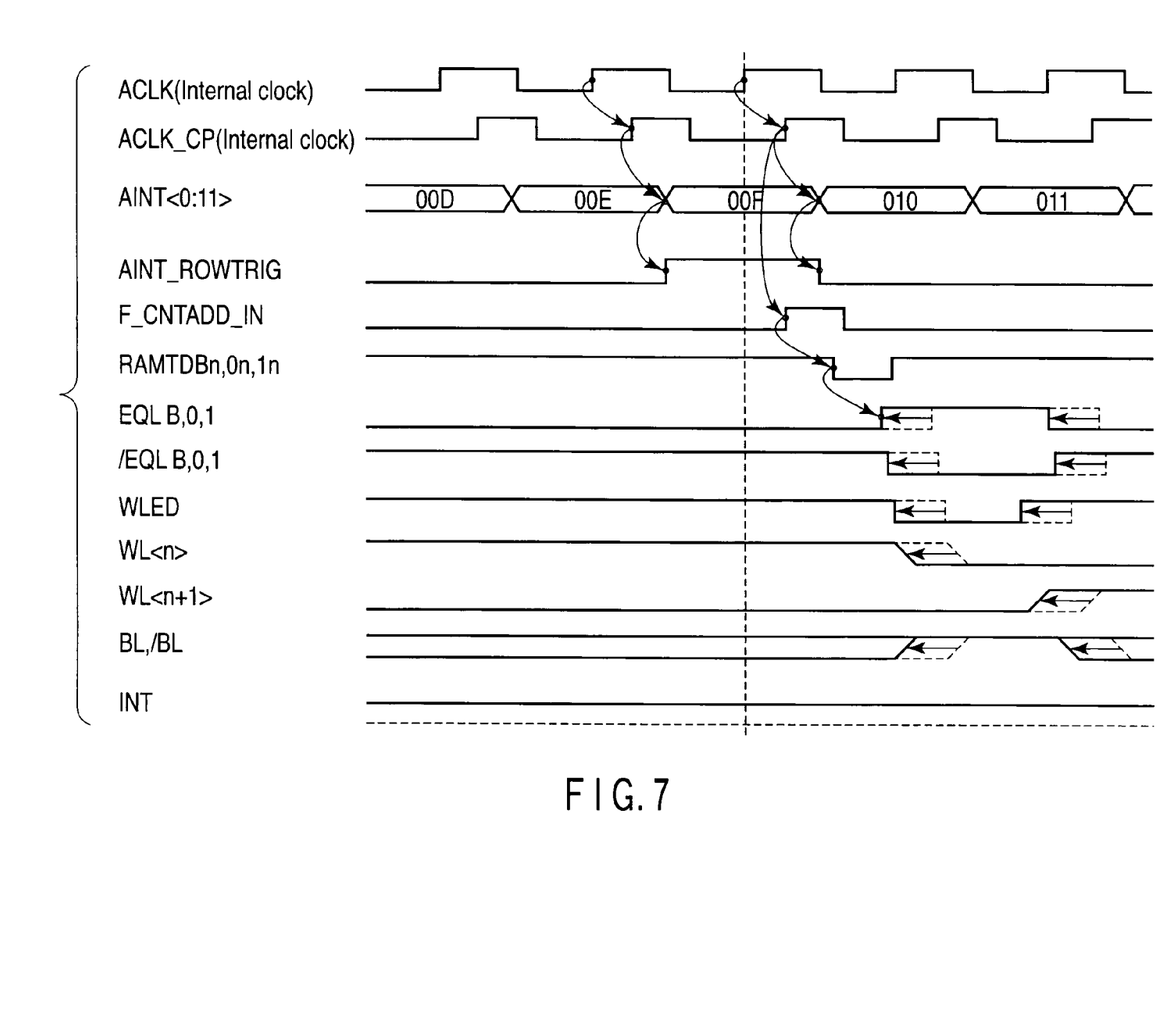
FIG. 7 is a timing chart showing a precharging operation in an internal operation to the SRAM cell array according to the embodiment.

FIG. 7 is a timing chart showing a precharging operation in an internal operation to the SRAM cell array.

In this case, loading and a program which are synchronized with an internal clock ACLK generated in the semiconductor memory device will be described. The loading is an operation for reading data from the NAND flash memory 1 to the SRAM 2. The program is an operation for writing data from the SRAM 2 to the NAND flash memory 1.

The external clock CLK, the internal clock CP, the address AEXT, the signal AEXT_ROWTRIG, and the signal F_CNTADD_EX shown in FIG. 6 are changed into the internal clock ACLK, the internal clock ACLK_CP, the address AINT, the signal AINT_ROWTRIG, and the signal F_CNTADD_IN, respectively, as shown in FIG. 7. Furthermore, the signal INT which designates that the operation is an internal operation becomes "H". Since the other operations are the same as the external synchronizing operations, a description thereof will be omitted.

Even in the internal operation, as in the external synchronizing operation, it is detected that an address previous to an address including a row address to which a row address is switched is output, and a precharging operation for precharging and equalizing the bit lines is activated. The precharging operation for performing precharging and equalizing may be activated according to a clock previous to a clock serving as a trigger for outputting an address including a row address to which a row address is switched.

In this manner, the precharging operation performed when selections of the word lines are switched can be advanced by 1 clock, and the read operation and the write operation can be performed at a high frequency and a high speed. In this manner, data transfer in the semiconductor memory device can be performed at a high speed. In this case, the example in which the precharging operation is advanced by 1 clock has been described. However, the precharging operation can also be advanced by 0.5 clocks or 1.5 clocks.

In a period during which a detection signal indicating the detection of an address previous to an address including a row address to which a row address is switched is output, a precharging operation for performing precharging and equalizing in synchronism with an internal clock is activated. In this manner, data obtained 1 clock before can be prevented from being damaged, and a word line can also be prevented from being erroneously selected.

[3] Effect of Embodiment

Figure 8:
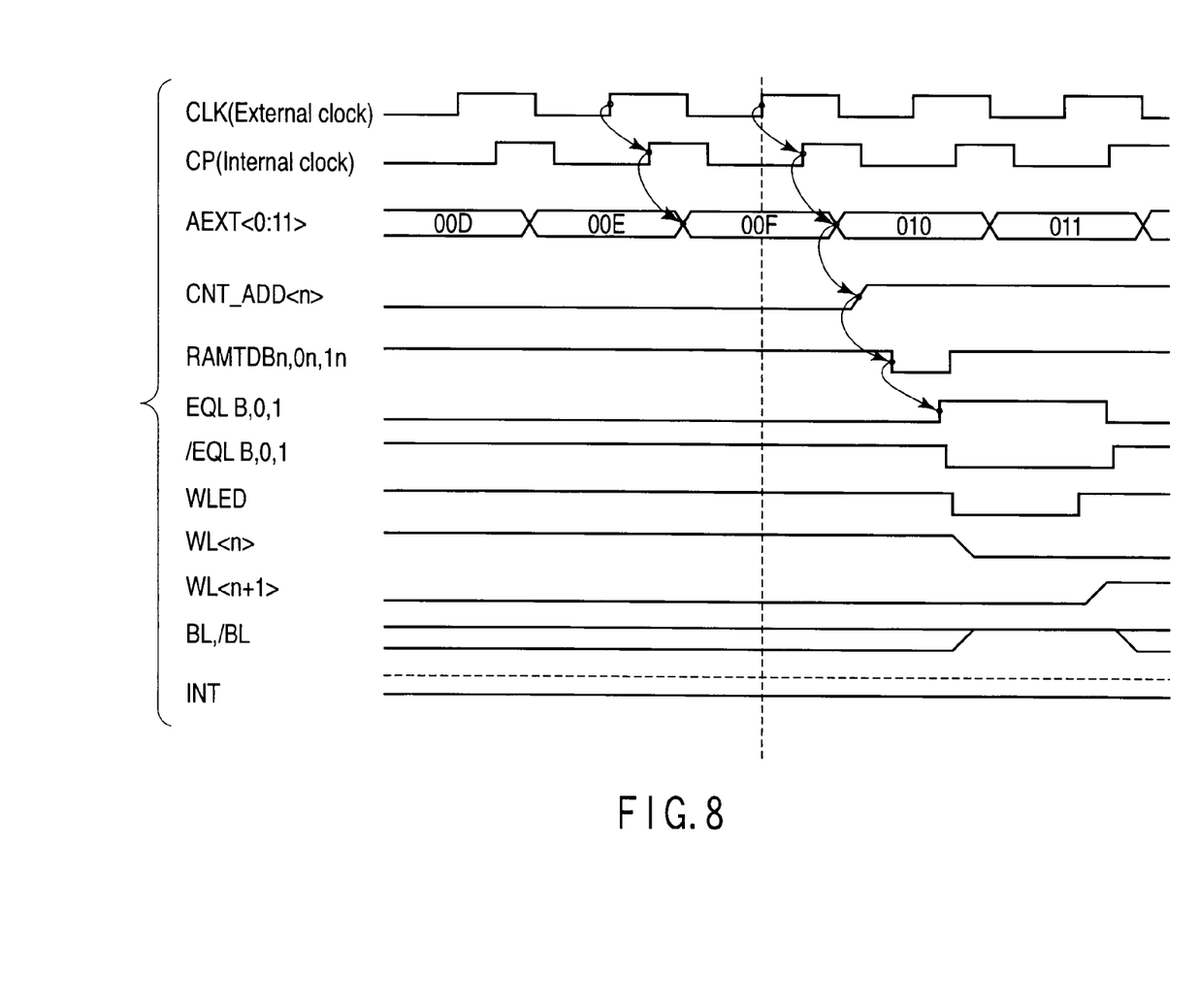
FIG. 8 is a timing chart showing a precharging operation in an external synchronizing operation to an SRAM cell array serving as a comparative example.

In order to simply explain an effect of the embodiment, a timing chart of a precharging operation is shown in FIG. 8 as a comparative example.

As shown in FIG. 8, in this comparative example, a change from address "00F" to address "010" is detected, i.e., an address to which a row address is switched is detected, and an equalizing signal EQL is activated through a signal CNT_ADD and a signal RAMTD. More specifically, switching of selections of word lines is detected, and a precharging operation for precharging and equalizing bit lines is activated by using the detection signal.

In contrast to this, as described above, in the embodiment, an address previous to an address including a row address to which a row address is switched is detected, and a precharging operation for precharging and equalizing bit lines is activated.

In this manner, in comparison with the comparative example, a time until the precharging operation is activated can be shortened. As a result, a time lag generated when selections of word lines are switched can be reduced, and a read operation and a write operation can be performed at a high frequency and a high speed.

In the embodiment, in a period during which a detection signal indicating the detection of an address previous to an address including a row address to which a row address is switched is output, a precharging operation for performing precharging and equalizing in synchronism with an internal clock is activated. In this manner, without damaging data obtained 1 clock before, the precharging operation to the bit lines can be rapidly activated while preventing a word line from being erroneously selected. In this case, a time until the precharging operation is activated can be advanced by about ½ clock in comparison with the comparative example. As a result, in the semiconductor memory device, an optimum high-speed operation can be set.

As described above, according to the embodiment, a counter address detecting circuit is added to make it possible to detect a counter address which is counted up by an internal clock. The timing charts shown in FIGS. 6 and 7 show a case in which a change from address "00E (hexadecimal number)" to address "00F" is detected by the counter address detecting circuit. In this manner, activation of precharging and equalizing performed to the bit lines can be advanced by about ½ clock.

Furthermore, when the internal clock synchronizing circuit is added to perform precharging and equalizing in synchronism with an internal clock, read data or write data obtained 1 clock before can be secured. When precharging and equalizing are started after an address is fixed, a word line can be prevented from being erroneously selected.

As described above, when activation of precharging and equalizing to bit lines is advanced, an operation frequency and an access time which are deteriorated in switching of selected word lines can be improved, i.e., the operation frequency can be increased, and the access time can be shortened.

The embodiment can provide a semiconductor memory device which can be operated at a high operation frequency or a high speed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a memory array having a plurality of memory cells arranged at crossing positions of word lines and bit lines;
    an address counter which increments an address including a row address and a column address in synchronism with a clock to sequentially output the incremented addresses;
    an address detecting circuit which detects an address previous to an address including a row address to which the row address is switched at the address output from the address counter to output a detection signal; and
    a control circuit which performs a precharging operation to the bit lines connected to the memory cells according to the detection signal output from the address detecting circuit.

2. The semiconductor memory device according to claim 1, wherein the previous address detected by the address detecting circuit is output immediately before the address including a row address to which the row address is switched.

3. The semiconductor memory device according to claim 1, wherein the precharging operation includes an operation for precharging and equalizing the bit lines when selections of the word lines arranged on the memory array are switched.

4. The semiconductor memory device according to claim 1, wherein the memory array includes an SRAM cell array.

5. A semiconductor memory device comprising:
    a memory array having a plurality of memory cells arranged at crossing positions of word lines and bit lines;
    an address counter which increments an address including a row address and a column address in synchronism with a clock to sequentially output the incremented addresses;
    an address detecting circuit which detects an address previous to an address including a row address to which the row address is switched at the address output from the address counter to output a detection signal;
    a clock synchronizing circuit which outputs an activation signal synchronized with the clock in a period during which the detection signal is output from the address detecting circuit; and
    a control circuit which performs a precharging operation to the bit lines connected to the memory cells according to the activation signal output from the clock synchronizing circuit.

6. The semiconductor memory device according to claim 5, wherein the previous address detected by the address detecting circuit is output immediately before the address including a row address to which the row address is switched.

7. The semiconductor memory device according to claim 5, wherein the precharging operation includes an operation for precharging and equalizing the bit lines when selections of the word lines arranged on the memory array are switched.

8. The semiconductor memory device according to claim 5, wherein the memory array includes an SRAM cell array.

9. A semiconductor memory device comprising:
    a memory array having a plurality of memory cells arranged at crossing positions of word lines and bit lines;
    an address counter which increments an address including a row address and a column address in synchronism with a clock to sequentially output the incremented addresses;
    an address detecting circuit which outputs a detection signal according to a clock previous to a clock serving as a trigger for outputting an address including a row address to which the row address is switched at the address output from the address counter; and
    a control circuit which performs a precharging operation to the bit lines connected to the memory cells according to the detection signal output from the address detecting circuit.

10. The semiconductor memory device according to claim 9, wherein the previous clock is a clock immediately before the clock serving as the trigger for outputting the address including a row address to which the row address is switched.

11. The semiconductor memory device according to claim 9, wherein the precharging operation includes an operation for precharging and equalizing the bit lines when selections of the word lines arranged on the memory array are switched.

12. The semiconductor memory device according to claim 9, wherein the memory array includes an SRAM cell array.

13. A semiconductor memory device comprising:
    a memory array having a plurality of memory cells arranged at crossing positions of word lines and bit lines;
    an address counter which increments an address including a row address and a column address in synchronism with a clock to sequentially output the incremented addresses;
    an address detecting circuit which outputs a detection signal according to a clock previous to a clock serving as a trigger for outputting an address including a row address to which the row address is switched at the address output from the address counter;
    a clock synchronizing circuit which outputs an activation signal synchronized with the clock in a period during which the detection signal is output from the address detecting circuit; and
    a control circuit which performs a precharging operation to the bit lines connected to the memory cells according to the activation signal output from the clock synchronizing circuit.

14. The semiconductor memory device according to claim 13, wherein the previous clock is a clock immediately before the clock serving as the trigger for outputting the address including a row address to which the row address is switched.

15. The semiconductor memory device according to claim 13, wherein the precharging operation includes an operation for precharging and equalizing the bit lines when selections of the word lines arranged on the memory array are switched.

16. The semiconductor memory device according to claim 13, wherein the memory array includes an SRAM cell array.

* * * * *